United States Patent
Hargreaves

(10) Patent No.: US 8,352,202 B2
(45) Date of Patent: Jan. 8, 2013

(54) SYSTEM AND METHOD FOR DETECTING INTERFERNCE IN A SENSOR DEVICE USING PHASE SHIFTING

(75) Inventor: Kirk Hargreaves, Sunnyvale, CA (US)

(73) Assignee: Synaptics Incorporated, Santa Clara, CA (US)

( * ) Notice: Subject to any disclaimer, the term of this patent is extended or adjusted under 35 U.S.C. 154(b) by 832 days.

(21) Appl. No.: 12/490,167

(22) Filed: Jun. 23, 2009

(65) Prior Publication Data

US 2010/0321034 A1 Dec. 23, 2010

(51) Int. Cl.
*G01R 13/00* (2006.01)
(52) U.S. Cl. ......................................................... 702/69
(58) Field of Classification Search ...................... 702/69
See application file for complete search history.

(56) References Cited

U.S. PATENT DOCUMENTS

| | | | |
|---|---|---|---|
| 4,794,208 A | 12/1988 | Watson | |
| 4,922,061 A | 5/1990 | Meadows et al. | |
| 5,113,042 A * | 5/1992 | Mletzko | 178/18.02 |
| 5,305,017 A | 4/1994 | Gerpheide | |
| 5,565,658 A | 10/1996 | Gerpheide et al. | |
| 5,831,600 A | 11/1998 | Inoue et al. | |
| 5,880,411 A | 3/1999 | Gillespie et al. | |
| 5,930,696 A | 7/1999 | Tzuang et al. | |
| 5,999,578 A | 12/1999 | Ha | |
| 7,031,886 B1 | 4/2006 | Hargreaves | |
| 7,451,050 B2 | 11/2008 | Hargreaves | |
| 2004/0096014 A1 | 5/2004 | Hendrix et al. | |

FOREIGN PATENT DOCUMENTS

| | | |
|---|---|---|
| EP | 0818751 A1 | 1/1998 |
| WO | 0124366 A1 | 4/2001 |

* cited by examiner

*Primary Examiner* — Stephen Cherry
(74) *Attorney, Agent, or Firm* — Ingrassia Fisher & Lorenz P.C.

(57) ABSTRACT

A capacitive sensor device and method is configured to respond a stimulus provided in a sensing region with an output signal. A signal generator is configured to apply a carrier signal to the capacitive sensor device. The carrier signal is switched between a plurality of phases at a switching rate, where the switching rate is less than a demodulation filter bandwidth. The result of the carrier phase shifting is that effects of interference in the output signal are frequency shifted away from the effects of user applied stimulus. An interference detection filter is configured to filter from the sensor outputs at least one effect produced by the stimulus. An interference measuring device is configured to determine a level of interference in the at least one interference output. Thus, the system can detect interference in the output of the capacitive sensor device.

21 Claims, 4 Drawing Sheets

SYSTEM AND METHOD FOR DETECTING INTERFERNCE IN A SENSOR DEVICE USING PHASE SHIFTING

FIELD OF THE INVENTION

This invention generally relates to electronic devices, and more specifically relates to sensor devices and to systems and methods for detecting interference in sensor devices.

BACKGROUND OF THE INVENTION

Proximity sensor devices (also commonly called touch sensor devices) are widely used in a variety of electronic systems. A proximity sensor device typically includes a sensing region, often demarked by a surface, in which input objects can be detected. Example input objects include fingers, styli, and the like. The proximity sensor device can utilize one or more sensors based on capacitive, resistive, inductive, optical, acoustic and/or other technology. Further, the proximity sensor device may determine the presence, location and/or motion of a single input object in the sensing region, or of multiple input objects simultaneously in the sensor region.

The proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

One issue with some past proximity sensor devices is effects of interference on the sensor device. In particular, difficulties have long been realized in identifying and reducing the effects of noise and other interferers upon the sensor device. Interference can originate from various sources, including display backlights, power supplies, wireless communication devices and the like. Although many sensors now include filtering that can effectively remove many types of interference, problems remain in identifying and removing interference with frequencies that are close to the sensor sensing frequency or any of its harmonics. These types of interferers are sometimes referred to as "tuned noise", and are difficult to identify or filter out. Specifically, because the effective "beat" frequency of the tuned noise is often very close to the frequency of signals resulting from user-applied stimulus the tuned noise will often appear as a stimulus applied to the sensing region. As a result, distinguishing the effects of undesirable tuned noise from the desirable effects of the stimulus can be quite difficult. Further, the time to observe tuned noise can be significant because the beat frequencies of such noise can be relatively low (e.g. on the order of 10 Hz or less), and therefore the period of an entire beat cycle can be significant (e.g. on the order of ten seconds for a beat frequency of 0.1 Hz). Further, in some instances the beat signal may be indistinguishable from a user input.

Nevertheless, several techniques for reducing the effects of interference, including tuned noise, have been attempted. One conventional interference avoidance technique involves comparing the output signals produced by operating the sensor at two or more different sensing frequencies when no stimulus is present on the sensing region, and then subsequently operating the sensor using the frequency that produces the lesser amount of interference. This technique has several disadvantages, however, in that determining whether the stimulus is present at any given time can be difficult in practice, particularly in the presence of significant external interference. Moreover, because this technique measures interference only when the stimulus is not present, sources of interference present within the stimulus itself (e.g. environmental radio frequency noise coupled to the sensor via the stimulus) are not considered.

Accordingly, it is desirable to provide systems and methods for quickly, effectively and efficiently detecting interference in a proximity sensor device, even when the frequency of the interference noise is close to the sensing frequency. Other desirable features and characteristics will become apparent from the subsequent detailed description and the appended claims, taken in conjunction with the accompanying drawings and the foregoing technical field and background.

BRIEF SUMMARY OF THE INVENTION

The embodiments described herein provide a system and method for detecting interference in an output of a capacitive sensor device. The capacitive sensor device is configured to modulate a carrier signal in response to a stimulus provided in a sensing region and generate an output signal. In accordance with the embodiments, a signal generator is configured to apply a carrier signal to the capacitive sensor device, and the capacitive sensor device is configured to produce sensor outputs which are in response to the modulated applied carrier signal. The carrier signal is switched between a plurality of phases at a switching rate, where the switching rate is less than a demodulation filter bandwidth. The result of the carrier phase shifting is that effects of interference in the output signal are frequency spread around the effects of user applied stimulus. An interference detection filter is configured to filter from the sensor outputs at least one effect produced by the stimulus, while at least one effect of the interference is passed to produce at least one interference output. An interference measuring device is configured to determine a level of interference in the at least one interference output. Thus, the system can detect interference in the output of the capacitive sensor device, even when that interference is close in frequency to that of the user applied stimulus.

In accordance with another embodiment, the carrier frequency is shifted to an alternate primary frequency when interference above a level is detected in the output of the capacitive sensor device. This technique may be repeated until the level of interference is at an acceptable level.

In another embodiment, a method of detecting interference in an output signal of a sensor is provided. The sensor is again configured to modulate a carrier signal in response to the proximity of a stimulus and produce an output signal. The method includes the step of applying the carrier signal to the sensor, with the applied carrier signal switching between at least a first phase and a second phase. In response, the sensor produces at least a first output corresponding to the first phase and a second output corresponding to the second phase. In this step, the switching between the at least the first phase and the second phase is performed at a rate less than the demodulation filter bandwidth.

The result of the carrier phase shifting is that effects of interference in the output signal are spread in frequency around the effects of user applied stimulus. An interference detection filter is configured to filter from the sensor outputs at least one effect produced by the stimulus, while at least one effect of the interference is passed to produce at least one interference output. The method further includes the step of filtering from at least the first and second outputs an effect produced by the stimulus to thereby produce at least one interference output, and determining interference contained within the at least one interference output. Thus, the method can detect interference in the output of the capacitive sensor device.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The embodiments described herein provide a system and method for detecting interference in an output of a capacitive sensor device. In accordance with the embodiments, a signal generator is configured to apply a carrier signal to the capacitive sensor device, and the capacitive sensor device is configured to modulate a carrier signal to produce sensor outputs in response to the user input. The carrier signal is switched between a plurality of phases at a switching rate. The result of the carrier phase shifting is that effects of interference in the output signal are broadened in frequency. An interference detection filter is configured to filter from the sensor outputs at least one effect produced by the stimulus, while at least one effect of the interference is passed to produce at least one interference output. An interference detection filter is configured to filter from the sensor outputs at least one effect produced by the stimulus, while at least one effect of the interference is passed to produce at least one interference output. An interference measuring device is configured to determine a level of interference in the at least one interference output. Thus, the system can detect interference in the output of the capacitive sensor device, even when that interference is close in frequency to that of the user applied stimulus.

Figure 1:
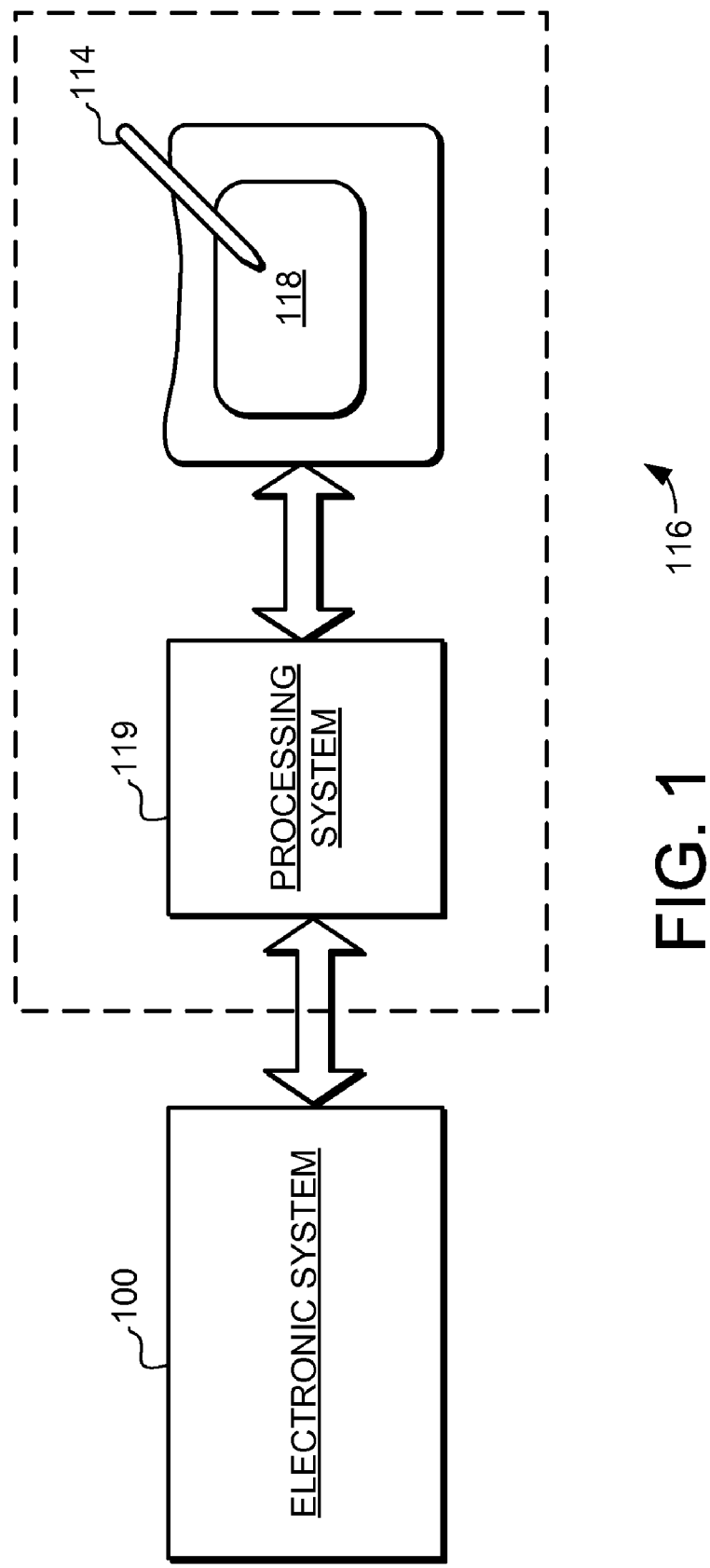
FIG. 1 is a block diagram of an exemplary system that includes an input device in accordance with an embodiment of the invention.

Turning now to the figures, FIG. 1 is a block diagram of an exemplary electronic system 100 that is coupled to an input device 116. The input device 116 is illustrated as a proximity sensor device (also often referred to as a touch pad or a touch sensor). As used in this document, the terms "electronic system" and "electronic device" broadly refers to any type of system capable of processing information. An input device associated with an electronic system can be implemented as part of the electronic system, or coupled to the electronic system using any suitable technique. As a non-limiting example, the electronic system may comprise another input device (such as a physical keypad or another touch sensor device). Additional non-limiting examples of the electronic system include personal computers such as desktop computers, laptop computers, portable computers, workstations, personal digital assistants, video game machines. Examples of the electronic system also include communication devices such as wireless phones, pagers, and other messaging devices. Other examples of the electronic system include media devices that record and/or play various forms of media, including televisions, cable boxes, music players, digital photo frames, video players, digital cameras, video camera. In some cases, the electronic system is peripheral to a larger system. For example, the electronic system could be a data input device such as a remote control, or a data output device such as a display system, that communicates with a computing system using a suitable wired or wireless technique.

The elements communicatively coupled to the electronic system, and the parts of the electronic system, may communicate via any combination of buses, networks, and other wired or wireless interconnections. For example, an input device may be in operable communication with its associated electronic system through any type of interface or connection. To list several non-limiting examples, available interfaces and connections include $I^2C$, SPI, PS/2, Universal Serial Bus (USB), Bluetooth, RF, IRDA, and any other type of wired or wireless connection.

The various elements (e.g. processors, memory, etc.) of the electronic system may be implemented as part of the input device associated with it, as part of a larger system, or as a combination thereof. Additionally, the electronic system could be a host or a slave to the input device. Accordingly, the various embodiments of the electronic system may include any type of processor, memory, or display, as needed.

Returning now to FIG. 1, the input device 116 includes a sensing region 118. The input device 116 is sensitive to input by one or more input objects (e.g. fingers, styli, etc.), such as the position of an input object 114 within the sensing region 118. "Sensing region" as used herein is intended to broadly encompass any space above, around, in and/or near the input device in which sensor(s) of the input device is able to detect user input. In a conventional embodiment, the sensing region of an input device extends from a surface of the sensor of the input device in one or more directions into space until signal-to-noise ratios prevent sufficiently accurate object detection. The distance to which this sensing region extends in a particular direction may be on the order of less than a millimeter, millimeters, centimeters, or more, and may vary significantly with the type of capacitive sensing technology used and the accuracy desired. Thus, embodiments may require contact with the surface, either with or without applied pressure, while others do not. Accordingly, the sizes, shapes, and locations of particular sensing regions may vary widely from embodiment to embodiment.

Sensing regions with rectangular two-dimensional projected shape are common, and many other shapes are possible. For example, depending on the design of the sensor array and surrounding circuitry, shielding from any input objects, and the like, sensing regions may be made to have two-dimensional projections of other shapes. Similar approaches may be used to define the three-dimensional shape of the sensing region. For example, any combination of sensor design, shielding, signal manipulation, and the like may effectively define a sensing region 118 that extends some distance into or out of the page in FIG. 1.

In operation, the input device 116 capacitively detects one or more input objects (e.g. the input object 114) within the sensing region 118. The input device 116 thus includes a sensor (not shown) that utilizes any combination of capacitive sensor components to implement one or more sensing regions (e.g. sensing region 118) and detect user input such as presences of object(s). Input devices may include any number of structures, such as one or more sensor electrodes, one or more other electrodes, or other structures adapted to capacitively detect object presence. These capacitive sensing techniques are advantageous to ones requiring moving mechanical structures (e.g. mechanical switches) as they may have a substantially longer usable life.

For example, sensor(s) of the input device 116 may use arrays or other patterns of capacitive sensor electrodes to support any number of sensing regions 118. As another example, the sensor may use capacitive sensing technology in combination with resistive sensing technology to support the same sensing region or different sensing regions. Examples of the types of technologies that may be used to implement the various embodiments of the invention may be found in U.S. Pat. Nos. 5,543,591, 5,648,642, 5,815,091, 5,841,078, and 6,249,234.

In some capacitive implementations of input devices, a voltage is applied to create an electric field across a sensing surface. These capacitive input devices detect the position of an object by detecting changes in capacitance caused by the changes in the electric field due to the object. The sensor may detect changes in voltage, current, or the like.

As an example, some capacitive implementations utilize resistive sheets, which may be uniformly resistive. The resistive sheets are electrically (usually ohmically) coupled to electrodes that receive from the resistive sheet. In some embodiments, these electrodes may be located at corners of the resistive sheet, provide current to the resistive sheet, and detect current drawn away by input devices via capacitive coupling to the resistive sheet. In other embodiments, these electrodes are located at other areas of the resistive sheet, and drive or receive other forms of electrical signals. Depending on the implementation, sometimes the sensor electrodes are considered to be the resistive sheets, the electrodes coupled to the resistive sheets, or the combinations of electrodes and resistive sheets.

As another example, some capacitive implementations utilize transcapacitive sensing methods based on the capacitive coupling between sensor electrodes. Transcapacitive sensing methods are sometimes also referred to as "mutual capacitance sensing methods." In one embodiment, a transcapacitive sensing method operates by detecting the electric field coupling one or more transmitting electrodes with one or more receiving electrodes. Proximate objects may cause changes in the electric field, and produce detectable changes in the transcapacitive coupling. Sensor electrodes may transmit as well as receive, either simultaneously or in a time multiplexed manner. Sensor electrodes that transmit are sometimes referred to as the "transmitting sensor electrodes," "driving sensor electrodes," "transmitters," or "drivers"—at least for the duration when they are transmitting. Other names may also be used, including contractions or combinations of the earlier names (e.g. "driving electrodes" and "driver electrodes." Sensor electrodes that receive are sometimes referred to as "receiving sensor electrodes," "receiver electrodes," or "receivers"—at least for the duration when they are receiving. Similarly, other names may also be used, including contractions or combinations of the earlier names. In one embodiment, a transmitting sensor electrode is modulated relative to a system ground to facilitate transmission. In another embodiment, a receiving sensor electrode is not modulated relative to system ground to facilitate receipt.

In FIG. 1, the processing system (or "processor") 119 is coupled to the input device 116 and the electronic system 100. Processing systems such as the processing system 119 may perform a variety of processes on the signals received from the sensor(s) of input devices such as the input device 116. For example, processing systems may select or couple individual sensor electrodes, detect presence/proximity, calculate position or motion information, or interpret object motion as gestures. Processing systems may also determine when certain types or combinations of object motions occur in sensing regions.

The processing system 119 may provide electrical or electronic indicia based on positional information of input objects (e.g. input object 114) to the electronic system 100. In some embodiments, input devices use associated processing systems to provide electronic indicia of positional information to electronic systems, and the electronic systems process the indicia to act on inputs from users. One example system responses is moving a cursor or other object on a display, and the indicia may be processed for any other purpose. In such embodiments, a processing system may report positional information to the electronic system constantly, when a threshold is reached, in response criterion such as an identified stroke of object motion, or based on any number and variety of criteria. In some other embodiments, processing systems may directly process the indicia to accept inputs from the user, and cause changes on displays or some other actions without interacting with any external processors.

In this specification, the term "processing system" is defined to include one or more processing elements that are adapted to perform the recited operations. Thus, a processing system (e.g. the processing system 119) may comprise all or part of one or more integrated circuits, firmware code, and/or software code that receive electrical signals from the sensor and communicate with its associated electronic system (e.g. the electronic system 100). In some embodiments, all processing elements that comprise a processing system are located together, in or near an associated input device. In other embodiments, the elements of a processing system may be physically separated, with some elements close to an associated input device, and some elements elsewhere (such as near other circuitry for the electronic system). In this latter embodiment, minimal processing may be performed by the processing system elements near the input device, and the majority of the processing may be performed by the elements elsewhere, or vice versa.

Furthermore, a processing system (e.g. the processing system 119) may be physically separate from the part of the electronic system (e.g. the electronic system 100) that it communicates with, or the processing system may be implemented integrally with that part of the electronic system. For example, a processing system may reside at least partially on one or more integrated circuits designed to perform other functions for the electronic system aside from implementing the input device.

In some embodiments, the input device is implemented with other input functionality in addition to any sensing regions. For example, the input device 116 can be implemented with buttons or other input devices near the sensing region 118. The buttons may be used to facilitate selection of items using the proximity sensor device, to provide redundant functionality to the sensing region, or to provide some other functionality or non-functional aesthetic effect. Buttons form just one example of how additional input functionality may be added to the input device 116. In other implementations, input devices such as the input device 116 may include alternate or additional input devices, such as physical or virtual switches, or additional sensing regions. Conversely, in various embodiments, the input device may be implemented with only sensing region input functionality.

Likewise, any positional information determined a processing system may be any suitable indicia of object presence. For example, processing systems may be implemented to determine "zero-dimensional" 1-bit positional information (e.g. near/far or contact/no contact) or "one-dimensional" positional information as a scalar (e.g. position or motion along a sensing region). Processing systems may also be implemented to determine multi-dimensional positional information as a combination of values (e.g. two-dimensional horizontal/vertical axes, three-dimensional horizontal/vertical/depth axes, angular/radial axes, or any other combination of axes that span multiple dimensions), and the like. Processing systems may also be implemented to determine information about time or history.

Furthermore, the term "positional information" as used herein is intended to broadly encompass absolute and relative position-type information, and also other types of spatial-domain information such as velocity, acceleration, and the like, including measurement of motion in one or more directions. Various forms of positional information may also include time history components, as in the case of gesture recognition and the like. As will be described in greater detail below, positional information from processing systems may be used to facilitate a full range of interface inputs, including use of the proximity sensor device as a pointing device for cursor control, scrolling, and other functions.

In some embodiments, an input device such as the input device 116 is adapted as part of a touch screen interface. Specifically, a display screen is overlapped by at least a portion of a sensing region of the input device, such as the sensing region 118. Together, the input device and the display screen provide a touch screen for interfacing with an associated electronic system. The display screen may be any type of electronic display capable of displaying a visual interface to a user, and may include any type of LED (including organic LED (OLED)), CRT, LCD, plasma, EL or other display technology. When so implemented, the input devices may be used to activate functions on the electronic systems. In some embodiments, touch screen implementations allow users to select functions by placing one or more objects in the sensing region proximate an icon or other user interface element indicative of the functions. The input devices may be used to facilitate other user interface interactions, such as scrolling, panning, menu navigation, cursor control, parameter adjustments, and the like. The input devices and display screens of touch screen implementations may share physical elements extensively. For example, some display and sensing technologies may utilize some of the same electrical components for displaying and sensing.

It should be understood that while many embodiments of the invention are to be described herein the context of a fully functioning apparatus, the mechanisms of the present invention are capable of being distributed as a program product in a variety of forms. For example, the mechanisms of the present invention may be implemented and distributed as a sensor program on computer-readable media. Additionally, the embodiments of the present invention apply equally regardless of the particular type of computer-readable medium used to carry out the distribution. Examples of computer-readable media include various discs, memory sticks, memory cards, memory modules, and the like. Computer-readable media may be based on flash, optical, magnetic, holographic, or any other storage technology.

Figure 2:
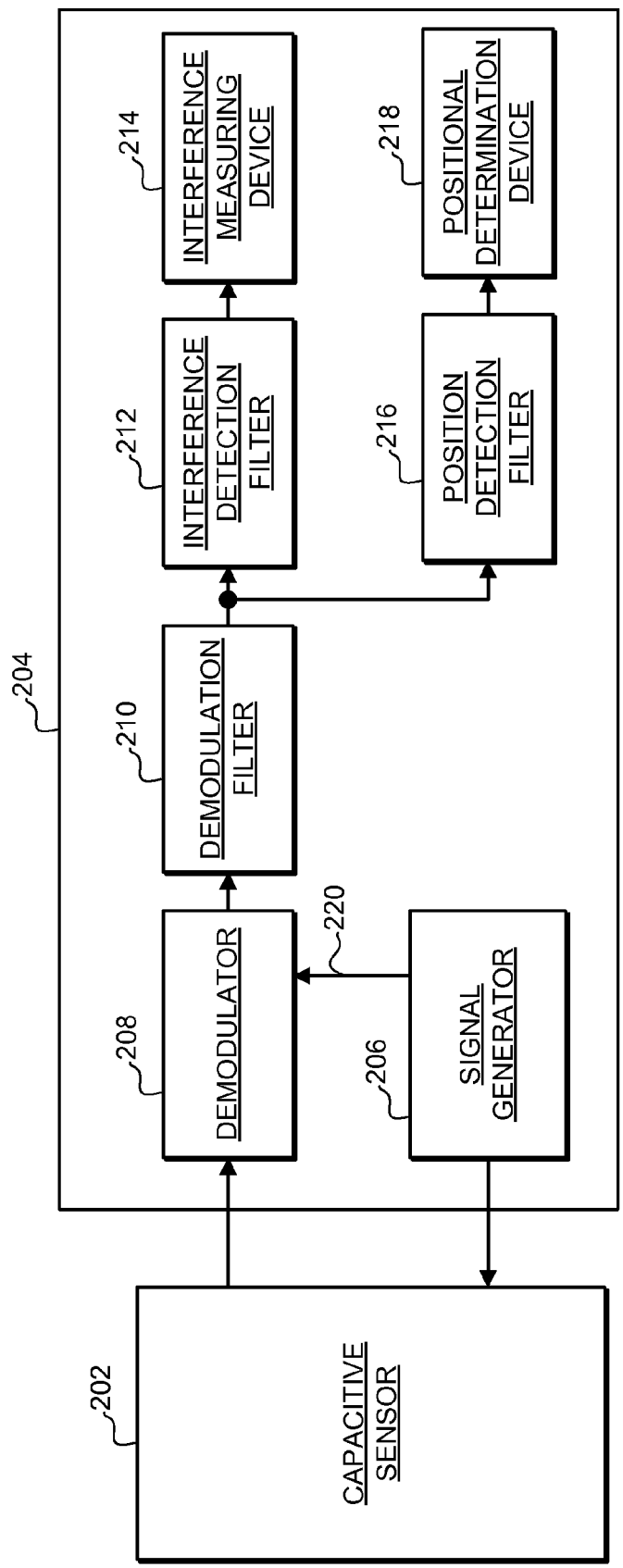
FIG. 2 is a block diagram of an exemplary input device in accordance with an embodiment of the invention.

As described above, the various embodiments provide a system and method system and method for detecting interference in an output of input device. Turning to FIG. 2, an exemplary input device 200 in accordance with these embodiments is illustrated. The input device 200 includes a capacitive sensor 202 and a processing system 204. In accordance with an embodiment, the processing system 204 includes a signal generator 206, a demodulator 208, a demodulation filter 210, an interference detection filter 212, an interference measuring device 214, a position detection filter 216 and a positional determination device 218. Again, these various elements in the processing system 204 can be implemented with one or more separate devices, or together within the same processing unit. Additionally, the processing system 204 can include other elements and functionality not illustrated in FIG. 2 (e.g., separate controllers and memory).

In general, the signal generator 206 is configured to apply a carrier signal to the capacitive sensor 202, and the capacitive sensor 202 is configured to modulate the carrier signal in response to a stimulus provided in the sensing region to produce sensor outputs. The sensor outputs are passed to the demodulator 208 and demodulation filter 210, where the demodulation signal is synchronous with the carrier signal. The output of the demodulation filter is passed to the interference detection filter 212 and the position detection filter 216. The output of the interference detection filter 212 is passed to the interference measuring device 214. The output of the position detection filter is passed to the positional determination device 218.

The demodulator 208 demodulates the sensor outputs using a demodulation signal. To facilitate demodulation, the demodulation signal is typically synchronous with the carrier signal. In some embodiments, the demodulation signal is derived from the carrier signal. In one specific embodiment, the carrier signal itself is used as the demodulation signal. Thus, the demodulation signal can be provided by the signal generator 206 or generated elsewhere. The demodulated sensor output is passed to the demodulation filter 210. The demodulation filter 210 is configured to remove out of band interference components from the output of the demodulator 208. In a typical embodiment, the demodulation filter 210 is implemented with a suitable low pass filter, and has an associated demodulation filter bandwidth.

In general, the output of the demodulation filter 210, the position detection filter, and the positional determination device 218 are used to determine positional information from stimulus (e.g., detected objects) in the sensing region of the capacitive sensor 202. As such the position detection filter 216 is typically implemented with a low pass filter that allows the effects of stimulus in the sensing region to the pass to the positional determination device 218. As was described above with reference to FIG. 1, the positional determination device 218 can be implemented to determine any suitable type of positional information from these effects, and provide that positional information to an associated electronic system.

In general, the interference detection filter 212 and the interference measuring device 214 are used to determine a level of interference in the output of the capacitive sensor 202. The interference detection filter 212 is configured to filter from the demodulated sensor outputs effects produced by stimulus in the sensing region of the capacitive sensor 202, while allowing the effects of interference to pass. In a typical embodiment, the interference detection filter 212 is implemented with a suitable high pass filter. The interference detection filter 212 generates an interference output that is passed to the interference measuring device 214. The interference measuring device 214 is configured to determine a level of interference in the interference output, and thus can be used to detect interference in the output of the capacitive sensor 202.

During such operation, the signal generator 206 is configured to apply the carrier signal to the capacitive sensor 202 with the carrier signal switching between a plurality of phases at a switching rate. The switching rate of the carrier signal phases is configured to be less than the bandwidth of the demodulation filter 210 In some embodiments the switching rate is also greater than the bandwidth of the position detection filter 216 and/or the bandwidth of the interference detection filter 212. The switching of the carrier signal phases results in the effects of interference in the sensor outputs being distinguished from the effects of stimulus, and thus facilitates the effects of interference being detected by the interference measuring device 214. Again, this technique is particular applicable to detecting interference such as "tuned noise" that has a beat frequency profile close to that of the effects of stimulus (e.g., objects) in the sensing region.

Specifically, the result of the carrier signal switching phases is that frequency bandwidth of the effects of stimulus in the demodulated sensor outputs is mostly invariant, but the frequency bandwidth of the effects of interference in the demodulated sensor output is broadened. Therefore, by filtering out the known bandwidth of the effects of stimulus with the interference detection filter 212, the remaining signal can therefore be determined to be indicative of noise and not indicative of stimulus. If the interference observed is excessive, it can be readily concluded that tuned noise or other interferes are present at or near the carrier frequency.

In such cases, the signal generator 206 can be configured to switch the carrier frequency to an alternate primary frequency that may have less interference. The method for detecting interference can then be performed at the new carrier frequency, with the carrier frequency switched whenever interference above a threshold level is detected. Thus, the method may be used multiple times before finding a carrier frequency that is free of excessive interference. Alternatively, the level of detected interference at the carrier frequencies may be measured and used to choose the carrier frequency that has the least interference.

As noted above, the signal generator 206 provides the carrier signal to the capacitive sensor 202. In some embodiments, the demodulation signal used by the demodulator 208 is also generated by the signal generator 206. For example, the carrier signal 220 can be used as the demodulation signal. In other embodiments, the demodulation signal is generated by other elements in the system. In either case, the carrier signal and the demodulation signal are typically implemented to be synchronous with each other and may coincide in some embodiments. In one embodiment suitable for use in a typical capacitive sensor, the carrier signal and the demodulation signal are produced at frequencies that range from about 20-500 kHz.

Demodulator 204 may be any circuit or element capable of demodulating the output signals of the capacitive sensor 202. The demodulator 204 may include any suitable digital or analog demodulator, sampled or continuous. The demodulation filter 210 may be implemented with any suitable low-pass or band-pass filter, including any sort of digital or analog filter, sampled or continuous. In various embodiments, demodulation filter 210 is an analog low pass filter having a bandwidth sufficient to remove high frequency noise components from the output signals of sensor 202. Demodulation filter 210 could alternatively be implemented and/or supplemented by a digital filter (e.g. an averaging filter). In an exemplary embodiment intended for use with carrier frequencies on the order of 10-50 kHz or so, demodulation filter 210 may have a bandwidth on the order of 150 to 500 Hz, although these exemplary values may vary widely from embodiment to embodiment. Furthermore, as will be described more fully below, the bandwidth of demodulation filter 210 is relevant in determining the rate at which the carrier signal phase is switched.

Figure 3:
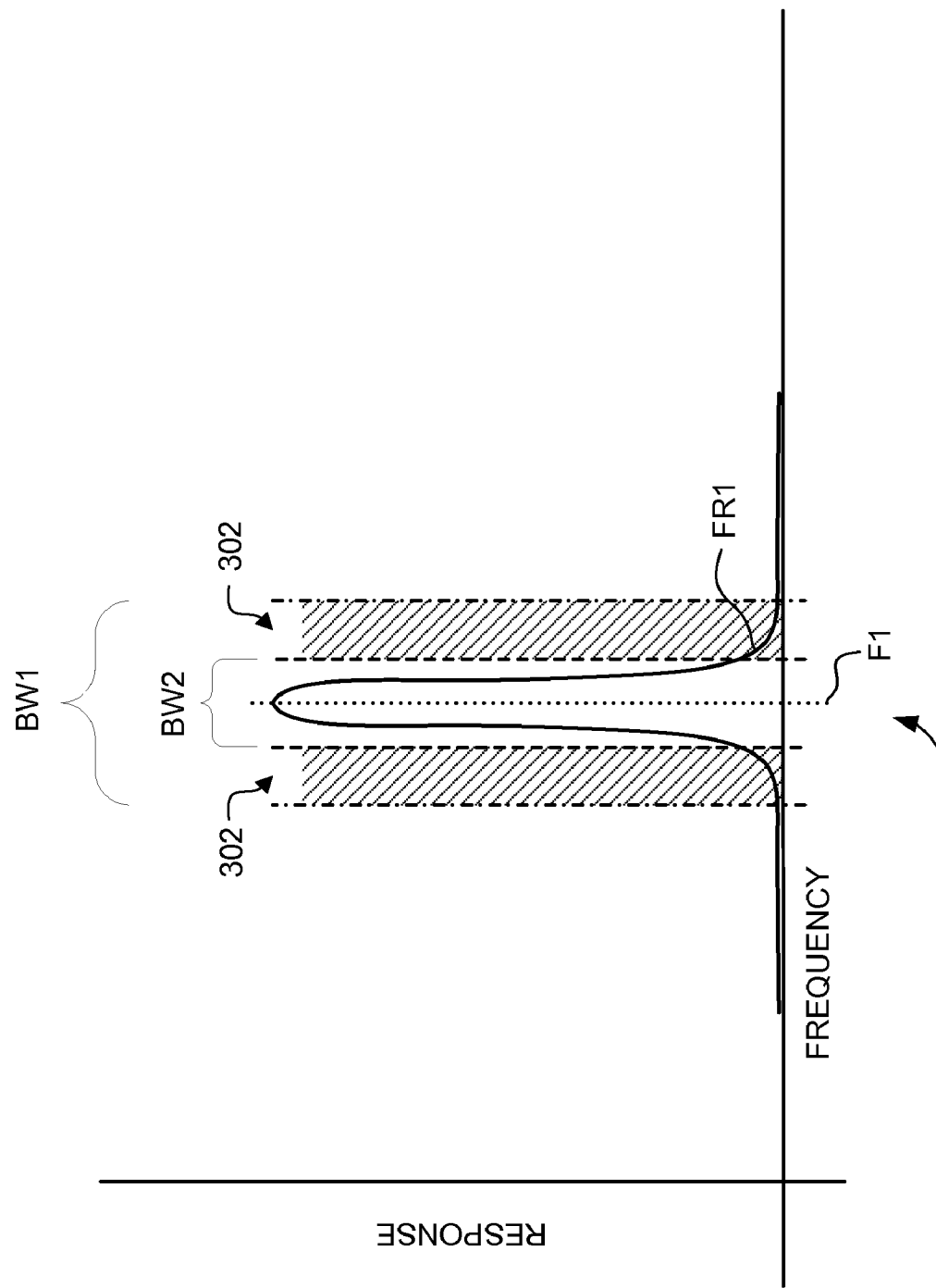
FIG. 3 is a plot showing an exemplary noise transfer function for a capacitive sensor along with filter responsiveness for several exemplary high pass filters in accordance with an embodiment of the invention.

FIG. 3 is a plot of frequency response for an exemplary embodiment capacitive sensor. The plot 300 illustrates an exemplary primary carrier frequency F1. Around the carrier frequency F1 is an exemplary demodulation filter bandwidth BW1, where the demodulation filter is implemented with a low pass filter. The area inside the bandwidth BW1 illustrates the frequency range for signals that will pass through such a demodulation filter.

Also around the carrier frequency F1 is an exemplary interference detection filter bandwidth BW2, where the interference detection filter is implemented with a high pass filter. The area outside the bandwidth BW2 illustrates the frequency range for signals that will pass through such an interference detection filter. Also illustrated in plot 300 is the frequency response FR1 of an exemplary position detection filter, where such a filter is implemented with a low pass filter. Signals that are outside the frequency response FR1 will be filtered out by the position detection filter.

As was described above, the carrier phase shifting causes the interference in the output signal of the capacitive sensor to be spread around and away from the effects of user applied stimulus. The practical effect is that interference near the carrier frequency is spread outside the interference detection filter bandwidth BW2. Thus, the output of the interference detection filter will include the signals are between the demodulation filter bandwidth BW1 and the interference detection bandwidth BW2, illustrated as hatched areas 302. This will include a significant amount of any interference that was at the carrier frequency and spread by the phase switching of the carrier frequency.

However, because the effects of the user applied stimulus modulate the carrier signal, and the modulated carrier signal is synchronous with the carrier signal, the effects of user applied stimulus would still be substantially inside the interference detection bandwidth BW2, and thus these effects will be substantially removed by the interference detection filter. The output of the interference detection filter will thus contain a significant amount of the effects of interference, with the effects of user applied stimulus. As such, the output of the interference detection filter can be used to determine a level of interference in the output of the capacitive sensor.

As was described above, capacitive sensors are highly susceptible to some types of interference. One particular type of such interference is noise having frequencies at or near the carrier frequency. Although such noise itself is generally a relatively high-frequency signal, such noise appears in the demodulated signal as a low "beat" frequency (e.g. at a frequency equal to the absolute difference between the noise frequency and the sensing frequency). Because beat frequencies produced by tuned noise may approximate the frequencies of signals produced by the user-applied stimulus, such noise can be very difficult to remove from the sensor output using conventional filtering. That is, it can be very difficult in practice to mask the effects of noise at or near carrier frequency without undesirably masking the effects of the user-applied stimulus at the same time. As a result, undetected tuned noise signals can have a significant adverse effect on sensor output.

Interference such as tuned noise at or near a carrier frequency, however, can be more effectively detected by adjusting the beat frequency of the interference to a more detectable frequency. Modulations in the phase of the carrier signal produce changes in the effective beat frequency of the interference. This allows interference such as tuned noise to appear as a higher frequency beat that is distinguishable from the effects of stimulus. Furthermore, the time required to detect the higher-frequency beat can be significantly less than the time required to detect a low-frequency beat, further improving the interference responsiveness of the capacitive sensor. Even further, the high pass interference detection filter can be configured such that interference within a few bandwidths of the carrier frequency is emphasized and detectable. This allows the system to detect interference sources that may drift into the sensitive bandwidth of the carrier frequency.

Figure 4:
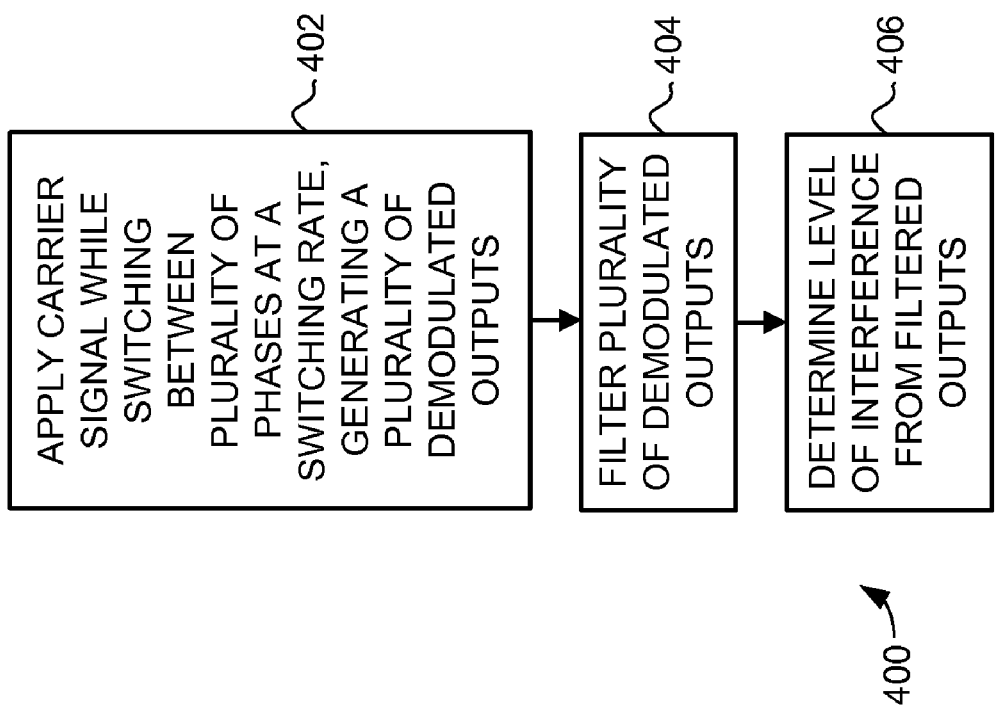
FIG. 4 is a flow diagram of a method of interference detection in accordance with an exemplary accordance with an embodiment of the invention.

FIG. 4 is a flowchart of an exemplary method 400 for detecting noise in sensor outputs from a capacitive sensor. It should be noted that the steps illustrated in FIG. 4 may be computer-implemented using software or firmware instructions, and that FIG. 4 is intended to illustrate various exemplary functions in logical form, and is not intended to necessarily present a literal implementation of a software routine. Accordingly, the various steps shown in FIG. 4 may be enhanced, eliminated and/or differently organized in the many alternate practical embodiments.

In the method 400, a sensor is configured to modulate a carrier signal in response to the proximity of a stimulus. The sensor produces an output signal. The output signal is demodulated with a demodulation signal and filtered with a demodulation filter having a demodulation filter bandwidth, thus producing a plurality of demodulated sensor outputs. Again, the demodulation signal is preferably synchronous with, and can be derived from the carrier signal.

The first step 402 in method 400 is to apply the carrier signal to the sensor, while the applied carrier signal is switching between a plurality of phases, the switching occurring at a switching rate. This step can be performed with a variety of different techniques. For example, the phase switching can be implemented by introducing appropriate time delays in the carrier signal. This can be done by adding or subtracting clock signals used to generate the carrier signal. In techniques that use direct digital synthesis to generate the carrier signal, the additional phase changes can be provided by phase accumulation. In either case, the applied carrier signal is controllable switched between a plurality of phases.

In response to the switching of the applied carrier signal, the sensor produces a plurality of outputs corresponding to the plurality of phases. In this step, the switching between the plurality of phases is performed at a switching rate that is less than the demodulation filter bandwidth. Also, the switching rate in some embodiments is also selected to be greater than the interference detection filter bandwidth and/or the position detection filter bandwidth.

A variety of different techniques can be used to implement the phase switching of the carrier signal. In general, the rate of phase shifting should be selected to be less than the demodulation filter bandwidth, such that tuned noise components and other interference in the sensor outputs are passed by both the high pass interference detection filter and demodulation filter, even though the substantial effects of any applied stimulus are removed by the high pass interference detection filter.

As one example, the switching can be performed between phases that are separated by substantially a multiple of 90 degrees, and in some specific implementations odd multiples of 90 degrees. In such an implementation, the phase switching may switch back and forth between two phases, or by switching by one 90 degree phase offset to the next. In either event, the 90 degree phase shifts in the carrier signal are performed at a rate that is less than the demodulation filter bandwidth.

As another example, the switching can be performed between phases that are separated by less than 90 degrees. Again, in such an implementation, the phase switching may switch back and forth between two phases, or may switch from one unrepeated phase to the next. As another example, the switching can be performed between phases that are separated by more than 90 degrees. Again, in such an implementation, the phase switching may switch back and forth between two phases, or may switch from one unrepeated phase to the next. In any of these cases, the phase shifts in the carrier signal are performed at a rate that is less than the demodulation filter bandwidth.

As a final example, the switching can be performed between continuously changing phase differences. For example, with randomly or pseudo randomly different phase increments. Again, in such an implementation, the phase shifts are performed at a rate that is less than the demodulation filter bandwidth.

Additionally, while the rate of the phase switching is performed at less than the demodulation filter bandwidth, the rate can be varying or held at a constant rate.

The next step 404 is to filter the plurality of demodulated sensor outputs. The filtering in this step is to remove at least one effect produced by stimuli in the sensing region from the sensor outputs. This produces at least one filtered interference output. In a typical embodiment, this filtering is performed with high pass filter. As noted above, most human-applied stimuli have relatively low effective frequencies (e.g., 10 Hz or less), so a high-pass filter capable of removing relatively low frequencies can be used to extract the low-frequency effects of the stimulus and thereby isolate the effects of the interference.

In some embodiments, an analog-to-digital conversion of the demodulated sensor output is performed before the filtering in step 404. In these embodiments, the interference detection filter would be implemented with a suitable high pass digital filter. In various embodiments, a high-pass filter is implemented using digital filtering techniques executed within a controller or other processing element. A simple digital difference filter, for example, effectively removes some low frequency components and thus can be used as an interference detection filter. Alternatively, a high-pass filter may be implemented using data sampling techniques (e.g. by selecting a data sampling length that is short enough to effectively exclude low frequency components in the sampled signal).

The next step 406 is to determine a level of interference from the at least one filtered interference output. Since the effects of stimulus in the sensing region are substantially removed from the effects of interference, any signal remaining results primarily from interference such as tuned noise near the frequency of interest. As a result, the filtered interference outputs can be individually and/or collectively processed in any manner to determine the amount of tuned noise present within the sensor.

A variety of different technique can be used to implement step 406. As one example, a measurement of the peak in the filtered interference output is compared to one or more threshold values. This facilitates a determination of the amount of interference without requiring a direct calculation of amount.

As other examples, the filtered interference outputs can be analyzed over any suitable period of time to determine an interference measurement. For example, the maximum absolute value of the interference outputs over some time period may be recorded. Alternatively, the average absolute values may be computed. Alternatively, the mean square or root mean square derivative may be computed.

In various further embodiments, the method also includes a shift of the carrier frequency if the detected level of interference is beyond specified level. Specifically, in some embodiments, if the amount of interference identified in the sensor outputs exceeds an acceptable level, the carrier frequency is appropriately shifted to an alternate value to allow subsequent operation at a carrier frequency that avoids the interference. The sensor may continue to detect noise at the new carrier frequency using the same or similar techniques. Through application of carrier signals with switching phases, the amount of tuned noise present at a particular carrier frequency can be evaluated, and frequency shifts can be applied only when needed to avoid interference. Alternatively, interference measurements could be gathered for two or more operating carrier frequencies, with subsequent operation taking place at the carrier frequency that contains the least amount of detected interference.

Using the techniques set forth above, the operation of a capacitive input device or other proximity sensor can be significantly improved by quickly detecting tuned noise and/or by avoiding such noise for subsequent operation. Various techniques described herein further allow for the removal of stimulus effects from noise detection, thereby allowing for noise detection even when a stimulus in a capacitive sensor's sensing region The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. An apparatus configured to detect interference in an output signal of a capacitive sensor, wherein the capacitive sensor is configured to modulate a carrier signal in response to a stimulus provided in a sensing region, wherein the output signal is demodulated using a demodulation signal and wherein the demodulated output signal is filtered by a demodulation filter having a demodulation filter bandwidth, the apparatus comprising:
   a signal generator configured to apply a carrier signal to the capacitive sensor, the capacitive sensor producing sensor outputs in response to the applied carrier signal, wherein the carrier signal switches between a plurality of phases at a switching rate that is less than the demodulation filter bandwidth, and wherein the demodulation signal is synchronous with the carrier signal;
   an interference detection filter configured to filter from the sensor outputs an effect produced by the stimulus to thereby produce at least one interference output; and
   an interference measuring device configured to determine a first level of interference in the at least one interference output.

2. The apparatus of claim 1 wherein the signal generator is configured to apply the carrier signal that switches between the plurality of phases at the switching rate by:
   switching between at least two phases of the plurality of phases, wherein phases of the at least two phases are separated by substantially a multiple of 90 degrees.

3. The apparatus of claim 1 wherein the signal generator is configured to apply the carrier signal that switches between the plurality of phases at the switching rate by:
   switching between at least two phases of the plurality of phases, wherein phases of the at least two phases are separated by less than 90 degree increments.

4. The apparatus of claim 1 wherein the signal generator is configured to apply the carrier signal that switches between the plurality of phases at the switching rate by:
   switching between at least two phases of the plurality of phases, wherein phases of the at least two phases are separated by more than 90 degree increments.

5. The apparatus of claim 1 wherein the signal generator is configured to apply the carrier signal that switches between the plurality of phases at the switching rate by:
   switching between at least two phases of the plurality of phases, wherein phases of the at least two phases are separated by randomly selected increments.

6. The apparatus of claim 1 wherein the carrier signal has a frequency, and wherein the signal generator is configured to change the frequency of the carrier signal in response to the determined first level of interference in the at least one interference output being beyond a threshold level.

7. The apparatus of claim 1 wherein:
   the signal generator is further configured to switch the carrier signal to a second primary frequency different from a first primary frequency, and to apply the carrier signal at the second primary frequency, the capacitive sensor producing a second sensor outputs in response to the applied carrier signal at the second primary frequency, wherein the carrier signal at the second primary frequency switches between a plurality of phases at a switching rate that is less than the demodulation filter bandwidth;
   the interference detection filter further configured to filter from the second sensor outputs an effect produced by the stimulus to thereby produce at least one second interference output;
   the interference measuring device further configured to determine a second level of interference in the at least one second interference output; wherein the signal generator is configured to use the carrier signal at the first primary frequency in response to the first level of interference being less than the second level of interference; and wherein the signal generator is configured to use the carrier signal at the second primary frequency in response to the second level of interference being less than the first level of interference.

8. The apparatus of claim 1 wherein the carrier signal has a frequency, and wherein the signal generator is configured to maintain the frequency of the carrier signal at a substantially constant frequency while switching the carrier signal between the plurality of phases.

9. The apparatus of claim 1 wherein the interference detection filter is coupled to the demodulation filter such that an output of the demodulation filter passes the sensor outputs to an input of the interference detection filter.

10. The apparatus of claim 9 wherein the output of the demodulation filter is coupled to an input of an analog-to-digital converter, and wherein the input of the interference detection filter is coupled to an output of the analog-to-digital converter.

11. The apparatus of claim 10 wherein the signal generator, the interference detection filter, the interference measuring device, the demodulation filter, and the analog-to-digital converter are implemented with a controller.

12. A method of detecting interference in an output signal provided by a sensor configured to modulate a carrier signal in response to the proximity of a stimulus, wherein the output signal is synchronously demodulated with a demodulation signal and the demodulated output signal is filtered by a demodulation filter having a demodulation filter bandwidth, the method comprising the steps of:

applying the carrier signal to the sensor, the sensor producing sensor outputs in response to the applied carrier signal, wherein the carrier signal switches between a plurality of phases at a switching rate that is less than the demodulation filter bandwidth;

filtering from the sensor outputs an effect produced by the stimulus to thereby produce at least one interference output;

determining interference contained within the at least one interference output; and providing an indication of the determined interference.

13. The method of claim 12 wherein the carrier signal switches between the plurality of phases at the switching rate by:

switching between at least two phases of the plurality of phases, wherein phases of the at least two phases are separated by substantially a multiple of 90 degrees.

14. The method of claim 12 wherein the carrier signal switches between the plurality of phases at the switching rate by:

switching between at least two phases of the plurality of phases, wherein phases of the at least two phases are separated by less than 90 degree increments.

15. The method of claim 12 wherein the carrier signal switches between the plurality of phases at the switching rate by:

switching between at least two phases of the plurality of phases, wherein phases of the at least two phases are separated by more than 90 degree increments.

16. The method of claim 12 wherein the switching rate is a varying rate.

17. The method of claim 12 wherein the carrier signal has a frequency, and further comprising the step of changing the frequency of the carrier signal in response to the indication of the of the determined interference being beyond a threshold level.

18. The method of claim 12 further comprising the steps of:

applying the carrier signal to the sensor at a second primary frequency different from a first primary frequency, the sensor producing second sensor outputs in response to the applied carrier signal at the second primary frequency, wherein the carrier signal at the second primary frequency switches between a plurality of phases at a switching rate that is less than the demodulation filter bandwidth;

filtering from the second sensor outputs an effect produced by the stimulus to thereby produce at least one second interference output;

determining interference contained within the at least one second interference output; and using the carrier signal at the first primary frequency in response to the at least one interference output being below a first level of interference;

using the carrier signal at the second primary frequency in response to the at least one second interference output being below a second level of interference.

19. The method of claim 12 wherein the carrier signal has a frequency, and wherein the frequency of the carrier signal is substantially maintained at a constant frequency while the switching between at least a first phase and a second phase.

20. The method of claim 12 wherein the step of filtering from at least the first and second outputs an effect produced by the stimulus to thereby produce at least one interference output comprises:

filtering an output of the demodulation filter.

21. An input device for detecting a user input, the input device comprising:

a sensor configured for detecting a stimulus of the user input and for providing an output signal in response thereto;

a processor in communication with the sensor, the processor is configured to:

generate a carrier signal having a sensing frequency;

demodulate the output signal of the sensor with the carrier signal;

filter the demodulated output signal with a filter having a demodulation filter bandwidth;

apply the carrier signal to the sensor, the applied carrier signal switching between at least a first phase and a second phase, the sensor producing at least a first output corresponding to the first phase and a second output corresponding to a the second phase in response to the applied carrier signal, and wherein the switching is performed at a frequency less than the demodulation filter bandwidth;

filter at least some of an effect produced by the stimulus from at least the first and second outputs to thereby produce at least one filtered output;

determine a measure of interference contained within the at least one filtered output; and shift the sensing frequency to an alternate sensing frequency if the measure of interference is determined to be beyond a threshold.

* * * * *